United States Patent

[11] 3,611,269

[72] Inventor Norman Leonard Reed
Aylesbury, England
[21] Appl. No. 19,539
[22] Filed Mar. 19, 1970
[45] Patented Oct. 5, 1971
[73] Assignee AMP Incorporated
Harrisburg, Pa.
[32] Priority Sept. 14, 1966
[33] Great Britain
[31] 40988/66
Continuation of application Ser. No. 663,732, Aug. 28, 1967.

[54] ELECTRICAL CIRCUIT ASSEMBLY

3 Claims, 5 Drawing Figs.

[52] U.S. Cl. .......... 339/176 S, 339/220
[51] Int. Cl. .......... H01r 9/16
[50] Field of Search .......... 339/176, 220, 59, 61, 210, 17, 144, 208, 221, 194, 214

[56] References Cited
UNITED STATES PATENTS

| | | | |
|---|---|---|---|
| 2,903,671 | 9/1959 | Dreher et al. | 339/198 |
| 2,984,813 | 5/1961 | Bossi | 339/59 |

*Primary Examiner*—Richard E. Moore
*Attorneys*—Curtis, Morris and Safford, Marshall M. Holcombe, William Hintze, William J. Keating, Frederick W. Caring, John C. Hopkins, Adrian J. La Rue and Jay L. Seitchik

ABSTRACT: An electrical circuit assembly comprises an insulating support upon one side of which is disposed an electrical circuit component having leads extending through apertures in the support with portions of the leads extending from the opposite side of the support. The portions of the leads are bent over to engage the opposite side of the support and the leads are sufficiently stiff to ensure that the circuit component is thereby secured to the support. The support with the circuit component in place thereon can be releasably mounted of an insulating member and posts positioned in the apertures, the posts pressing the leads against the walls of the apertures thereby effecting electrical engagement therebetween.

ELECTRICAL CIRCUIT ASSEMBLY

This is a continuation of application Ser. No. 663,732, filed Aug. 28, 1967.

The present invention relates to an electrical circuit assembly.

In the manufacture of electric circuits it may be required to releasably connect the leads of a circuit component arranged on an insulating support to electrical posts for connection to further leads. A circuit component may be formed by an individual circuit element, for example a resistor or a capacitor or by a number of such circuit elements, the element or elements being encapsulated, for example, in a modular pack. Although the component leads may be connected to the post through electrical sockets crimped or soldered to the leads, the crimping or soldering operations involved are time consuming and especially in the case of miniature circuits the sockets are difficult to construct. Further to this, each lead must be attached to its connector by an individual soldering or crimping operation. A circuit component should be readily removable from the support for replacement when required.

According to one object of the present invention, an electrical circuit assembly comprises an insulating support upon one side of which is disposed an electrical circuit component having leads extending through apertures in the support with portions of the leads extending from the opposite side of the support, these portions having been bent over to engage the opposite side of the support and the leads being sufficiently stiff to ensure that the circuit component is thereby secured to the support.

Another object of the invention is that an insulating member may be secured, preferably releasably, to the support to urge the bent-over portions of the leads against the opposite side of the support. The insulating member may be releasably secured to the support by press studs which may be formed integrally with the support and the insulating member; however, it is preferred that the insulating member and the support are arranged for sliding engagement with one another, so that in securing the insulating member to the support the projecting portions of the leads are bent over by engagement with the insulating member so as to lie against the opposite side of the support.

An additional object is that an insulating member may be releasably secured to the support and positioned to trap free ends of the leads between the insulating member and the support.

A still further object is that an electrically conductive post may be inserted in the apertures in the support to trap the lead therein between the post and the aperture wall. The apertures in the wall may be tapered to ensure firm electrical connection between the post and the leads and may have internal projections, for example ribs extending longitudinally, for resilient engagement with the post.

Still an additional object is that the portions of the posts which engage in the aperture of the support may be longitudinally slotted to render these portions laterally resilient. The posts can be connected to further leads, for example by electrically conductive clips securing the leads to the posts or by wrapping the further leads about the posts.

Other objects and attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

Embodiments of the invention will now be described by way of example, reference being made to the accompanying drawings, in which.

Figure 1:
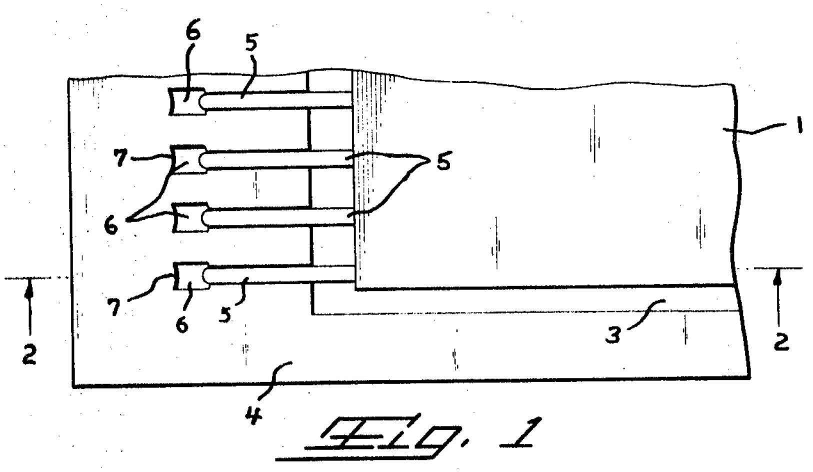
FIG. 1 is a fragmentary plan view of an electrical circuit assembly according to the invention.
Figure 2:
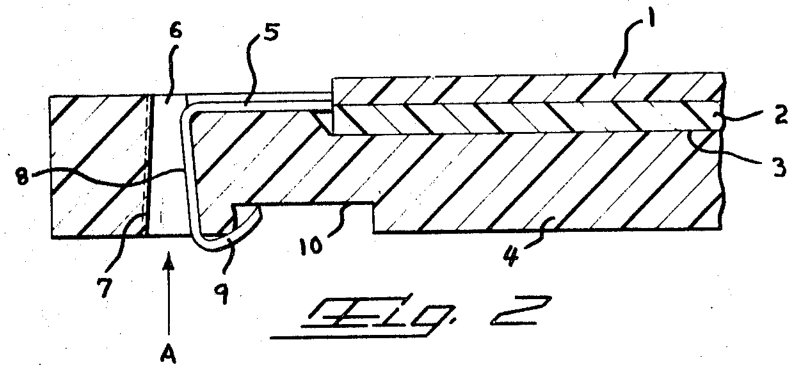
FIG. 2 is a sectional view on the lines 2—2 of FIG. 1.

FIGS. 1 and 2 show an electrical circuit component, formed by a flat modular pack comprising portions 1 and 2 cemented together and containing electrical components (not shown) for example resistors, capacitors, or transistors, disposed in a recess 3 in one side of an insulating support 4. The modular pack has extending from opposite ends (only one end is shown) leads 5 which are stiffly flexible, being made for example of a cobalt-copper-nickel alloy. The leads 5 emerge between the portions 1 and 2 through seals (not shown) for example, of glass, and extend through tapered apertures 6 in the support 4. These apertures 6 have longitudinally extending arcuate section ribs 7, as best seen in FIG. 1. Leads 5 have portions 8 which lie against the walls of the apertures 6 and portions 9 which extend from the other, i.e. the lower as seen in FIG. 2, side of the support 4. The portions 9 have been bent over the edges of the apertures 6 to secure the flat modular pack to the support 4, the free ends of the portions 9 lying in recesses 10 (only one of which is shown) in the lower surface of the support 4.

Figure 3:
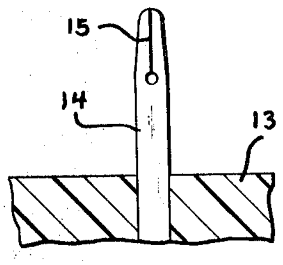
FIG. 3 is a fragmentary cross-sectional view of an insulating block carrying an electrical post.
Figure 5:
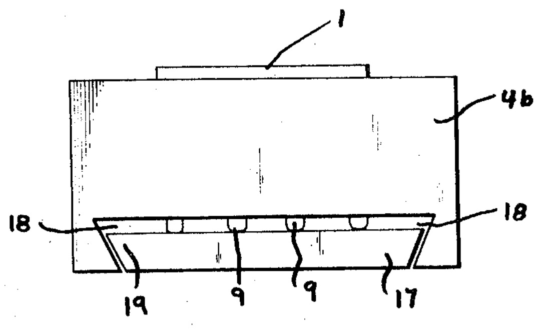
FIG. 5 is an end elevation illustrating a further modification of the assembly.

As shown in FIG. 3, an insulating block 13 carries electrical posts 14 (only one of which is shown) these posts having chamferred upper (as seen in FIG. 3) ends with longitudinal slots 15 which render the upper ends of the posts laterally resilient.

Each post 14 can be inserted into one of the apertures 6 in the direction indicated by the arrow A, so that the post 14 traps the portion 8 of the lead 5 between the post 14 and the aperture wall, firm electrical connection between the post and the portion 8 being ensured by the resilient compression of the ribs 7 in the aperture by the post and by the resilience of the upper end of the post.

To produce the assembly shown in FIGS. 1 and 2 the leads 5 of the pack 1, 2 are first inserted through the aperture 6 from the upper (as seen in FIG. 2) side of the support 4 so that the pack 1, 2 seats in the recess 3 and the portions 9 of the leads 5 project from the opposite side of the support 4. The portions 9 are then bent over against the edges of the aperture 6 so that the free ends of the portions 9 lie in the recesses 10.

The pack may be readily removed from the support by bending the portions 9 back to their original positions and pulling the pack away from the support.

Figure 4:
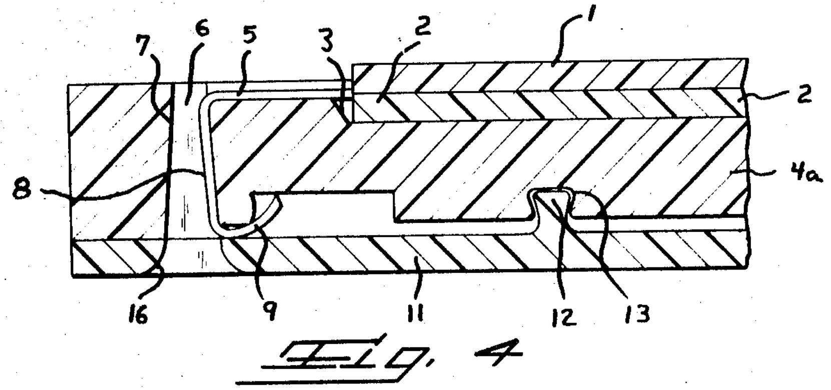
FIG. 4 is a view similar to FIG. 2, showing a modification.

In a modification shown in FIG. 4 the portions 9 of the leads 5 are trapped between the support 4*a* and an insulating member 11, releasably secured to the support 4*a* by press studs formed by projections 12 on the member 11 and complementary recesses 13 in the support 4*a* . The insulating member 11 has apertures 16 which communicate with the apertures 6 when the support 4*a* and the member 11 are relatively positioned as shown in FIG. 4.

The production of the assembly shown in FIG. 4 is generally similar to that described in connection with FIGS. 1 and 2, with the additional step that the member 11 is attached to the support 4*a* to trap the portions 9 between the support 4*a* and the member 11.

In a further modification shown in FIG. 4, a support 4*b* is modified to receive a member 17, having the same function as the member 11 but arranged for sliding engagement with the member 4. In this case the member 4*b* has a longitudinally extending groove 18 receiving complementary edge portions 19 of the member 17. The portions 9 are bent over to engage the support 4*b* by the leading edge (not shown) of the member 17 as it is slid into place, the leading edge preferably being chamferred Although not shown, each post 14 has a portion for connection to an electrical lead for example by an electrically conductive clip securing the lead to the post or by wrapping the lead about the post.

If desired, the pack 1 may be replaced by individual circuit components, for example condensers or resistors having leads of sufficient length to extend through the aperture 6 and bent over to engage the support 4.

It will, therefore, be appreciated that the aforementioned and other desirable objects have been achieved; however, it should be emphasized that the particular embodiments of the invention, which are shown and described herein, are intended as merely illustrative and not as restrictive of the invention.

The invention is claimed in accordance with the following:

1. An electrical circuit assembly comprising an insulating support provided with a component-receiving surface, said support having apertures formed therein and extending to the surface opposed to the component-receiving surface, an electrical circuit component mounted on said component-receiving surface, said component having stiffly flexible leads extending outwardly therefrom and having a first section lying adjacent said component-receiving surface, a second section disposed along a wall of one of said apertures and a third section lying on said surface opposed to said component-receiving surface, each of said apertures being dimensioned wedgingly to receive an electrically conductive post, said apertures being tapered in the direction of insertion of said electrically conductive post to wedge said post in said aperture and against said second portion of said lead, and a longitudinally extending arcuate projection formed in the wall defining said aperture and being radially opposed to said second portion of said lead to urge said electrically conductive post against said second portion.

2. An electric circuit assembly comprising an insulating support having a first surface, said first surface having a component-receiving zone, said support having apertures formed therein and extending between said first support and an opposite surface of said support, said apertures being located in said surfaces intermediate said component-receiving zone and the edges of said support, an electrical circuit component mounted on said first surface at said component-receiving zone, said component having stiffly flexible leads extending outwardly therefrom and having a first section lying on said first surface adjacent said component-receiving zone, a second section disposed along a wall of one of said apertures adjacent said component-receiving zone, said second section being movable relative to said aperture wall, and a third section lying on said opposite surface of the support generally parallel to said first surface, each of said apertures being dimensioned to receive an electrically conductive post inserted therein to make lateral electrical connection with said second section of said lead.

3. An electrical circuit assembly as set forth in claim 2 further comprising an insulating member disposed adjacent the said opposite surface of the support for maintaining said third sections of the lead wires against said opposite surface, and electrically conductive post means extending through said insulating member and into respective apertures and wedgingly forcing said second sections of said lead wires against the aperture walls thereby effecting lateral electrical connection therewith.

PO-1050
(5/69)

UNITED STATES PATENT OFFICE
CERTIFICATE OF CORRECTION

Patent No. 3,611,269 Dated October 5, 1971

Inventor(s) NORMAN LEONARD REED

It is certified that error appears in the above-identified patent and that said Letters Patent are hereby corrected as shown below:

Claim 2, column 4, line 4, "support" should be --- surface --- .

Signed and sealed this 14th day of March 1972.

(SEAL)
Attest:

EDWARD M.FLETCHER,JR.
Attesting Officer

ROBERT GOTTSCHALK
Commissioner of Patents